(12) United States Patent
Eitan et al.

(10) Patent No.: US 11,996,858 B2
(45) Date of Patent: May 28, 2024

(54) COMPARATOR CIRCUIT WITH SPEED CONTROL ELEMENT

(71) Applicant: Retym, Inc., Pleasanton, CA (US)

(72) Inventors: Roee Eitan, Haifa (IL); Yaakov Dayan, Jerusalem (IL); Yosi Sanhedrai, Bet Shemesh (IL); Aviv Berg, Beit Keshet (IL); Esther T. Fridman, Jerusalem (IL); Kirill Blum, Nesher (IL)

(73) Assignee: Retym, Inc., Pleasanton, CA (US)

( * ) Notice: Subject to any disclaimer, the term of this patent is extended or adjusted under 35 U.S.C. 154(b) by 68 days.

(21) Appl. No.: 17/745,756

(22) Filed: May 16, 2022

(65) Prior Publication Data

US 2023/0370080 A1   Nov. 16, 2023

(51) Int. Cl.
| | |
|---|---|
| *H03M 1/12* | (2006.01) |
| *H02P 23/18* | (2016.01) |
| *H03K 5/22* | (2006.01) |
| *H03K 5/24* | (2006.01) |
| *H03M 1/06* | (2006.01) |

(52) U.S. Cl.
CPC .............. *H03M 1/12* (2013.01); *H02P 23/186* (2016.02); *H03K 5/22* (2013.01); *H03K 5/24* (2013.01); *H03M 1/0607* (2013.01)

(58) Field of Classification Search
CPC ........ H03M 1/12; H03M 1/0607; H03K 5/22; H03K 5/08; H03K 5/24
See application file for complete search history.

(56) References Cited

U.S. PATENT DOCUMENTS

| | | | |
|---|---|---|---|
| 5,065,055 | A | 11/1991 | Reed |
| 5,661,423 | A | 8/1997 | Mizuhara |
| 5,821,750 | A | 10/1998 | Hasegawa |
| 5,821,780 | A | 10/1998 | Hasegawa |
| 8,362,934 | B2 | 1/2013 | Matsuzawa et al. |
| 2005/0242844 | A1 | 11/2005 | Hughes |

(Continued)

FOREIGN PATENT DOCUMENTS

| | | | | |
|---|---|---|---|---|
| CN | 111147056 B | 4/2022 | | |
| EP | 1681764 A2 | * | 7/2006 | ............ H03F 1/3211 |
| EP | 3217550 A1 | 9/2017 | | |

OTHER PUBLICATIONS

International Search Report and Written Opinion (Retym, Inc.) for PCT/US2023/021942 dated May 11, 2023 (8 pages).

(Continued)

*Primary Examiner* — Joseph J Lauture
(74) *Attorney, Agent, or Firm* — DLA Piper, LLP (US)

(57) ABSTRACT

A comparator circuit with a speed control element is disclosed herein. The speed control element may include a variable voltage source and one or more transistors. Using a voltage supplied by the variable voltage source, the one or more transistors may control a swing of a clock signal to provide a swing controlled clock signal to an amplification portion of the comparator circuit. The swing controlled clock therefor may be used to control the speed of the comparator circuit (e.g., an amplification phase) based on a level of noise in the circuit. The swing controlled clock may further be used to align an output common voltage of the comparator circuit with switching voltages of downstream logic cells (e.g., inverters) connected to the comparator circuit.

20 Claims, 5 Drawing Sheets

(56) References Cited

U.S. PATENT DOCUMENTS

2009/0002035 A1   1/2009  Yamamoto
2021/0119623 A1   4/2021  Nishida et al.
2022/0052673 A1   2/2022  Chen et al.

OTHER PUBLICATIONS

Abbas et al., "Clocked Comparator for High-Speed Applications in 65nm Technology," IEEE Asian Solid-State Circuits Conference, 2010. (4 pages).
Office Action and Search Report from Taiwan Patent Application No. 112117928, dated Mar. 4, 2024, 5 pages.

* cited by examiner

COMPARATOR CIRCUIT WITH SPEED CONTROL ELEMENT

The present disclosure generally relates to a clocked comparator circuit, and more particularly, to an improved clocked comparator circuit with a speed control element.

BACKGROUND

A clock comparator is a component used in various applications such as analog to digital converters (ADCs), serializer/deserializer (SERDES) and high-speed communication circuits. The reliability, sensitivity and accuracy of the comparator's decisions is strongly dependent on the thermal noise which is also generated by the comparator itself. The comparator's noise and decision speed are correlated, in so that improving the comparator's performance, for example, by lowering the noise level (e.g., by spending more time on integration) will slow down the comparator operation. Comparators are generally measured by speed and accuracy (noise). In advance node processes, the variation between speed and noise is more significant due to, process, voltage, and temperature (PVT) spread. Conventional comparators, however, do not have a mechanism to control their speeds.

This proposal come to balance between these two parameters according to each process. Allowing to operate the comparator in optimal operating point by controlling the speed on the fly.

SUMMARY

Embodiments disclosed herein solve the aforementioned technical problems and may provide other technical solutions as well. In some example embodiments, a speed control element may be provided for a comparator circuit. The speed control element may include a variable voltage source and one or more transistors. Using a voltage supplied by the variable voltage source, the one or more transistors may control a swing of a clock signal to provide a swing controlled clock signal to an amplification portion of the comparator circuit. The swing controlled clock therefor may be used to control the speed of the comparator circuit (e.g., an amplification phase) based on a level of noise in the circuit. The swing controlled clock may further be used to align an output common voltage of the amplifier based comparator circuit with switching voltages of downstream logic cells (e.g., inverters) connected to the comparator circuit.

In an example embodiment, a speed control element for a comparator circuit may include a variable voltage source configured supply a variable voltage to one or more transistors; the one or more transistors configured to: receive a clock signal; control a swing of the clock signal to generate a swing controlled clock signal based on the variable voltage supplied by the variable voltage source; and provide the swing controlled clock signal to control a speed of an amplification phase of the comparator circuit.

In another embodiment, a comparator circuit may include a speed control element comprising: a variable voltage source configured supply a variable voltage to one or more transistors; the one or more transistors configured to: receive a clock signal; control a swing of the clock signal to generate a swing controlled clock signal based on the variable voltage supplied by the variable voltage source; and provide the swing controlled clock signal to control a speed of an amplification phase of the comparator circuit.

In yet another embodiment, a method of controlling a speed of a comparator circuit may include supplying, by a variable voltage source of a speed control element of a comparator circuit, a variable voltage to one or more transistors of the speed control element; receiving, by the one or more transistors, a clock signal; controlling, by the one or more transistors, a swing of the clock signal to generate a swing controlled clock signal based on the variable voltage supplied by the variable voltage source; and providing, by the one or more transistors, the swing controlled clock signal to control a speed an amplification phase of the comparator circuit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrated only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to an improved comparator design. More specifically, embodiments disclosed herein generally relate to an improved comparator design that utilizes a speed control element to help reduce the comparator's noise.

There have been some attempts at reducing the comparators noise. For example, conventional systems have attempted to reduce the comparator's noise by controlling the capacitance (e.g., by adding capacitors) of the internal nodes. However, adding such capacitors increases the constant parasitic capacitance which impacts the whole PVTs variations. Another attempt to reduce the comparator's noise is by changing the input common mode. However, such approach typically requires adaptation from the previous stages.

To understand the noise mechanism and its impact on the comparator's operation, an introduction on comparators is explained below. As an example, a StrongARM comparator will be introduced below. As those skilled in the art recognize, such architecture is exemplary and is not meant to limit the types of comparators that may utilize a speed control element.

Figure 1:
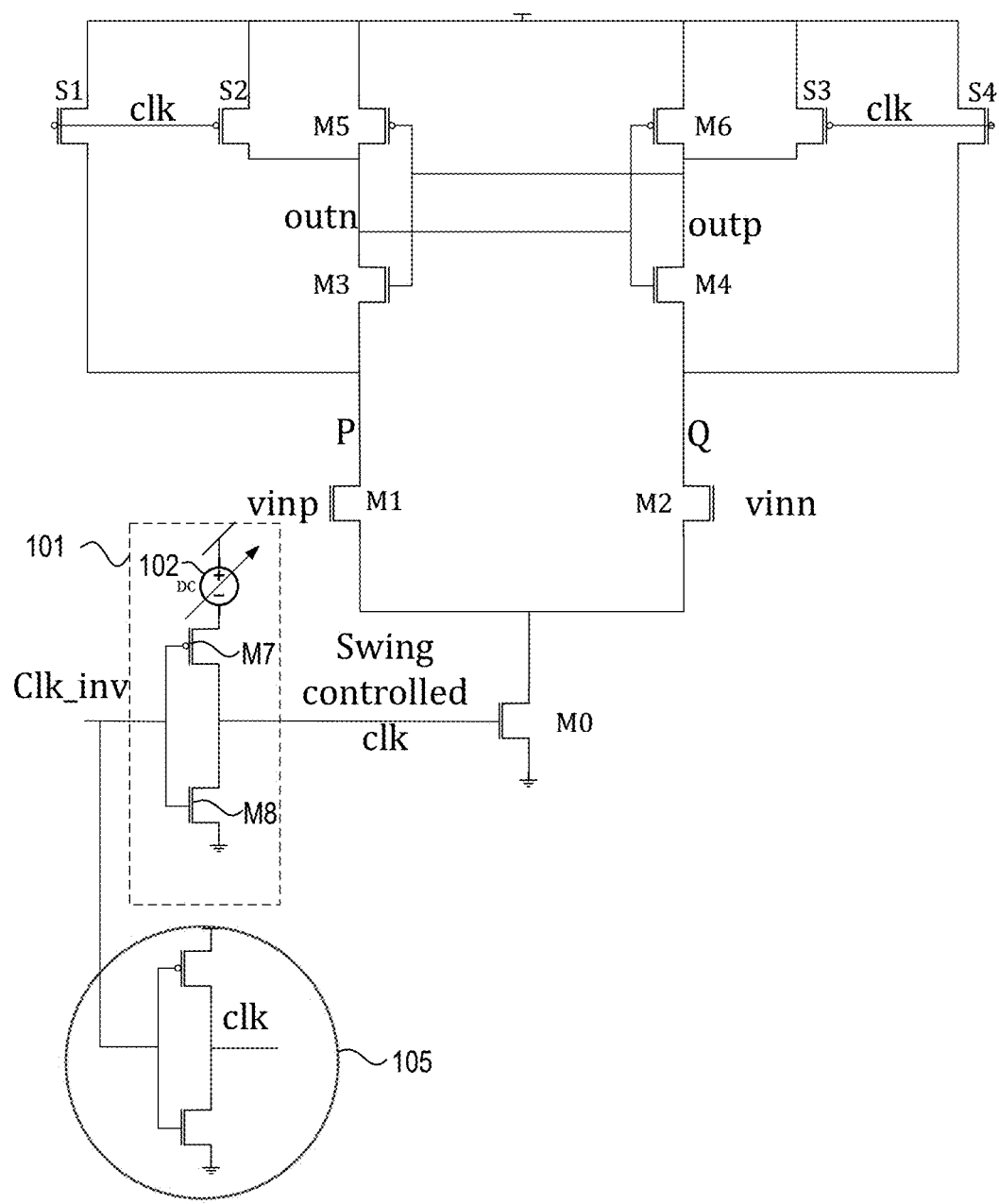
FIG. 1 is a schematic circuit diagram of a StrongARM comparator with an additional speed control element, according to example embodiments.

FIG. 1 a schematic circuit diagram of a StrongARM comparator 100 ("comparator 100") with an additional speed control element 101, according to example embodiments.

As shown, comparator 100 may include a plurality of switches S1-S4 (which may be, in some embodiments, formed using transistors) and a plurality of transistors M0-M6. Transistors M0-M6 may include a clocked differential pair M1 and M2, a first cross-coupled pair M3 and M4, and a second first cross-coupled pair M5 and M6. Comparator 100 may further include node P and node Q. In operation, comparator 100 may go through several phases.

The first phase may refer to the reset phase. In the reset phase, clock (clk) signal is low (e.g., the state of the clk signal is at "0" logic level). Accordingly, in the reset phase M0 is turned off because the swing controlled clk signal is also low and controls the gate terminal of the M0. In this phase (clk is low) S1-S4 are conducting since they are PMOS devices, compared to M0, which is an NMOS device. Turning M0 off and turning S1-S4 on charges the internal nodes (P, Q, $Out_p$ and $Out_n$) to "1" logic level of $V_{dd}$.

Figure 3:
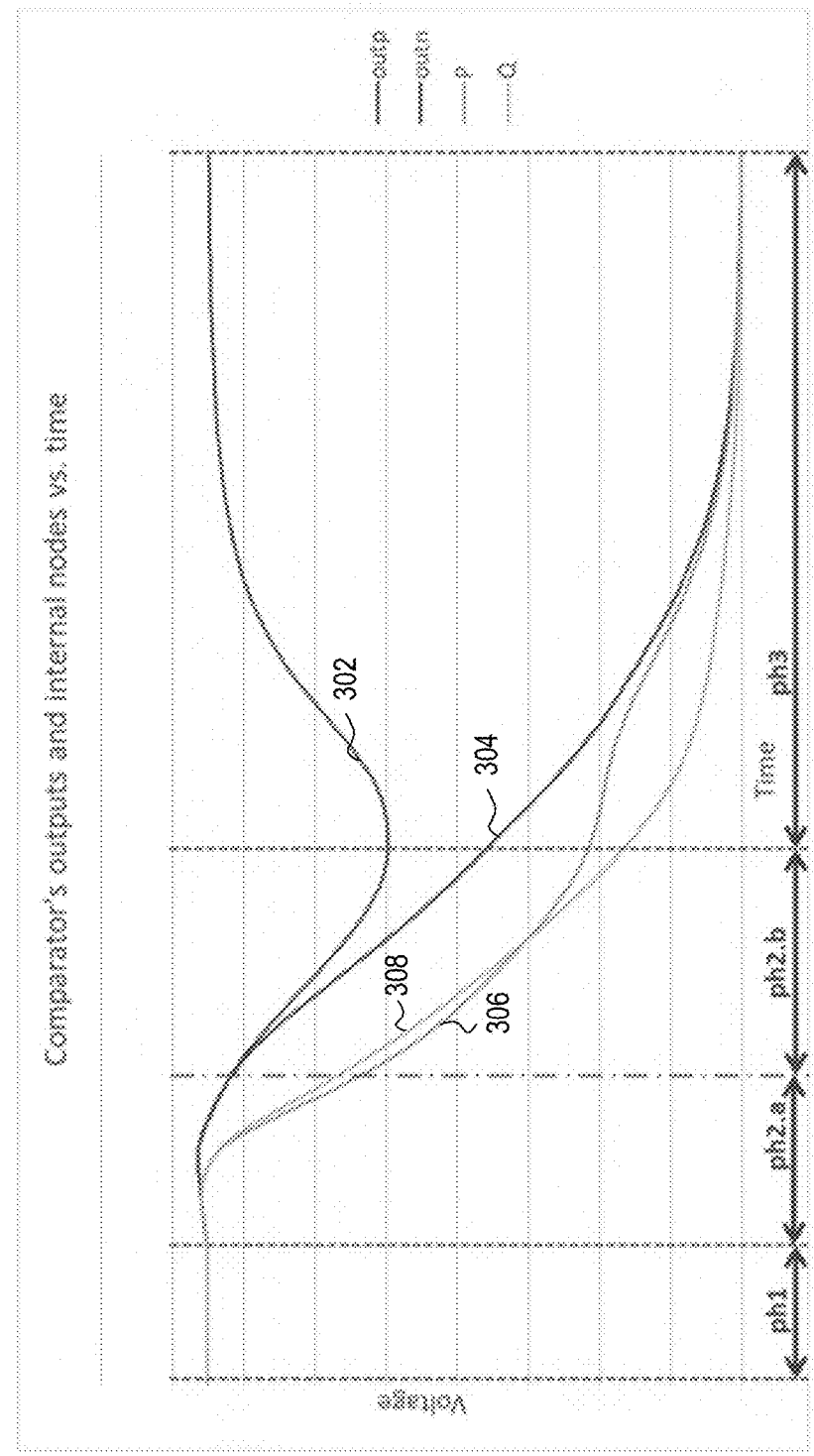
FIG. 3 is a chart illustrating the operation phases of the StrongARM comparator of FIG. 1, according to example embodiments.

The second phase may refer to the amplification phase. In the amplification phase, the clk signal and the "swing controlled clk" are high ("1" logic level). Accordingly, in the amplification phase, M0 may be turned ON, pulling its drain towards ground, letting the input pair M1-M2 conduct. The current starts flowing from nodes P and Q through the input pair M1-M2, when the current of each one of them is dependent on its gate's voltage (input signals, $vin_p$ and $vin_n$). Because the input signals $vin_p$ and $vin_n$ are differential and not necessarily equal, the current that flows through M1 and M2 is different and generates amplification of the differential input signals $vin_p$ and $vin_n$ on nodes P and Q. This discharge (or amplification) process keeps going until P and Q reach the "ON" voltage of $V_{dd}$-$V_t$. (as shown in FIG. 3, ph2.a). and turning on transistors M3 and M4 which discharge $Out_p$ and $Out_n$ accordingly (depending on the differential input signal) (FIG. 3, ph2.b). The result of this phase is an amplification of the input signal $vin_p$ and $vin_n$ on the output nodes to generate the amplified signals $Out_p$ and $Out_n$.

The third phase starts when either $Out_p$ and $Out_n$ reach its "ON" voltage (voltage level of $V_{dd}$-$V_t$), turning-on one of the cross-coupled transistors M5/M6. Once one of them turned on, the associated output net is pulling up and enables the positive feedback of back-to-back inverters (e.g., M3-M6) (as shown in FIG. 3, ph3). For example, back-to-back inverters may charge the outputs, ($Out_p$, $Out_n$) to $V_{dd}$ and $V_{ss}$.

The phase that is typically most sensitive to noise is the amplification phase. The amplification phase may be particularly sensitive to noise because, during the amplification phase, the voltage difference between nodes P and Q and as consequence $Out_p$ and $Out_n$ of comparator 100 is generated. The noise in the amplification stage that is created from this process or any other source can result in a flip of the stage output, resulting in a comparator wrong decision. Further, because the noise is integrated during the amplification phase, slowing down this phase, using the speed control element 101, will decrease the input referred noise of comparator 100. The speed control element 101 may, by controlling the speed, bring down the noise to a desired level of noise for amplification during the amplification stage.

Due to the correlation between the speed and noise of comparator 100, it is possible to slow down the comparator in the noisy PVT, using the speed control element 101, and still meet the speed requirements. This speed limitation is stronger in the slow PVT, the noise may be low and therefore slowing down the speed is not required.

Speed control element 101 may be configured to control the speed of comparator 100 by limiting the current which flows through M0. As shown, speed control element 101 may include a transistor M7, a transistor M8, and a variable voltage source 102. Speed control element 101 can limit the current through M0 by changing the voltage level of the clock signal that is applied to M0 gate. To do so, speed control element 101 may control the supply of M0's driver (i.e., gate voltage for M0) using transistor M7, transistor M8, and variable voltage source 102. In other words, the swing is controlled by supply voltage ($V_{DD}$) of the transistors M7 and M8 and the applied DC voltage $V_{DC}$ of the variable voltage source 102. In addition to controlling the speed, by reducing M0's gate voltage swing, M0 may operate more in the saturation region and therefore the gain is increased and the common mode rejection ratio (CMRR) may be improved.

As shown, a portion of speed control element 101 is emphasized in circle 105. The circled portion 105 of the speed control element 101 indicates that the polarity of S1-S4's gate signal is the same as M0, but with a constant supply because the original (i.e., non-swing-controlled) clock signal is used for S1-S4.

Figure 2:
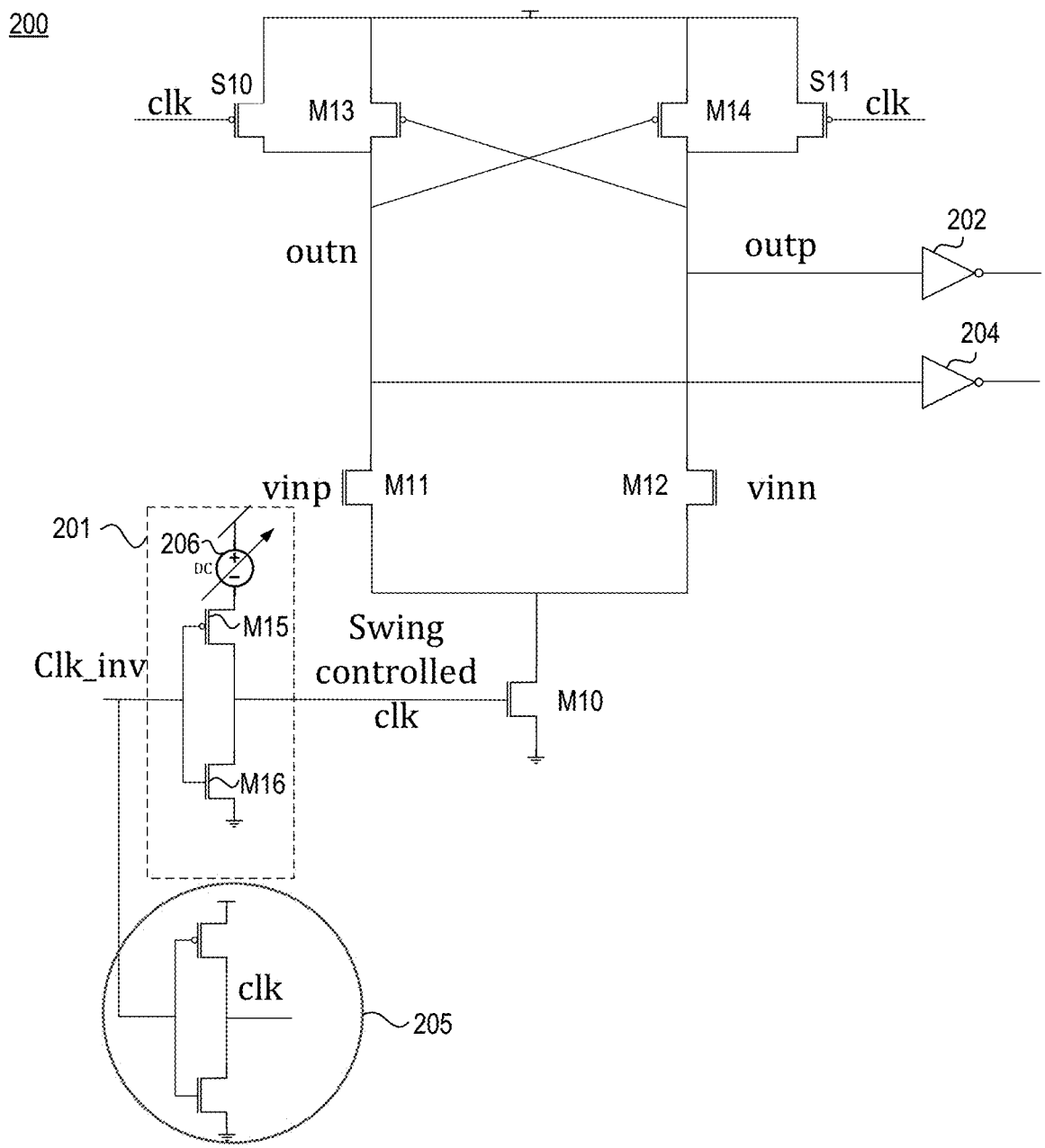
FIG. 2 is a schematic circuit diagram of an amplifier-based comparator with an additional speed control element, according to example embodiments.

FIG. 2 is a schematic circuit diagram of an amplifier-based comparator 200 ("comparator 200") with speed control element 201, according to example embodiments.

As shown, comparator 200 may include a plurality of switches S10-S11 (which may be, in some embodiments, formed using transistors) and a plurality of transistors M10-M14. Transistors M10-M14 may include a clocked differential pair M11 and M12 and a cross-coupled pair M13 and M14. Comparator 200 may further followed by inverter 202 and inverter 204. Inverter 202 and inverter 204, or any other logic cells, may be used to open the signal toward rail to rail, which may be achieved after one or few logic cell stages.

For comparator 200, the alignment of the comparator 200's output common voltage to the next (or downstream) logic cells' switching point, e.g., an inverter (202 and 204 in the shown embodiment, but it can be other logic cells as well) may be desired. If, for example, these voltages are not aligned, the output of the logic cell may not be changed independently to the comparator decision. To align the output common voltage to the next logic cells' switching point, comparator 200 may use the speed control element 201 in addition to the purpose of noise reduction.

Speed control element 201 may include a transistor M15, a transistor M16, and a variable voltage source 206. Speed control element 201 can limit the current through M10 by changing the voltage level of the clock signal that is applied to M10 gate in addition may be configured to align the output common voltage to the next logic sell by changing M10's voltage swing. For example, controlling the voltage swing of M10's gate using speed control element 201 can be used to coordinate between the output common voltage to switching point of the next logic cell (inverters 202 and 204 in FIG. 2).

As shown, a portion of speed control element 201 is emphasized in circle 205. The circled portion of speed control element 201 emphasizes that the polarity of S10-S11's gate signal is the same as M0, but with a constant supply, because the original (i.e., non-swing-controlled) clock signal is used for S10-S11.

FIG. 3 is a chart 300 illustrating the operation phases of a comparator (e.g., a StrongARM comparator without a speed control element 101), according to example embodiments. As shown, the chart 300 illustrates the output voltages at output $Out_p$ (reference numeral "302"), output $Out_n$ (reference numeral "304"), node P (reference numeral "306"), and node Q (reference numeral "308") over time during the various phases. First, following the output $Out_n$, the output voltage of comparator 100 at $Out_n$ is steady during phase one, until it begins to drop during phase two. The output voltage of comparator 100 at $Out_n$ continues to fall until it reaches zero during phase three. Second, following the output of $Out_p$, the output voltage at $Out_p$ follows a similar descent from phase one to phase two, but due to the amplification a differential voltage is developed between $Out_n$ and $Out_p$ at phase two. In consequence, at phase three, one output dropping to zero ($Out_n$ in chart 300) and one output raising to Vdd ($Out_p$ in chart 300).

Figure 4:
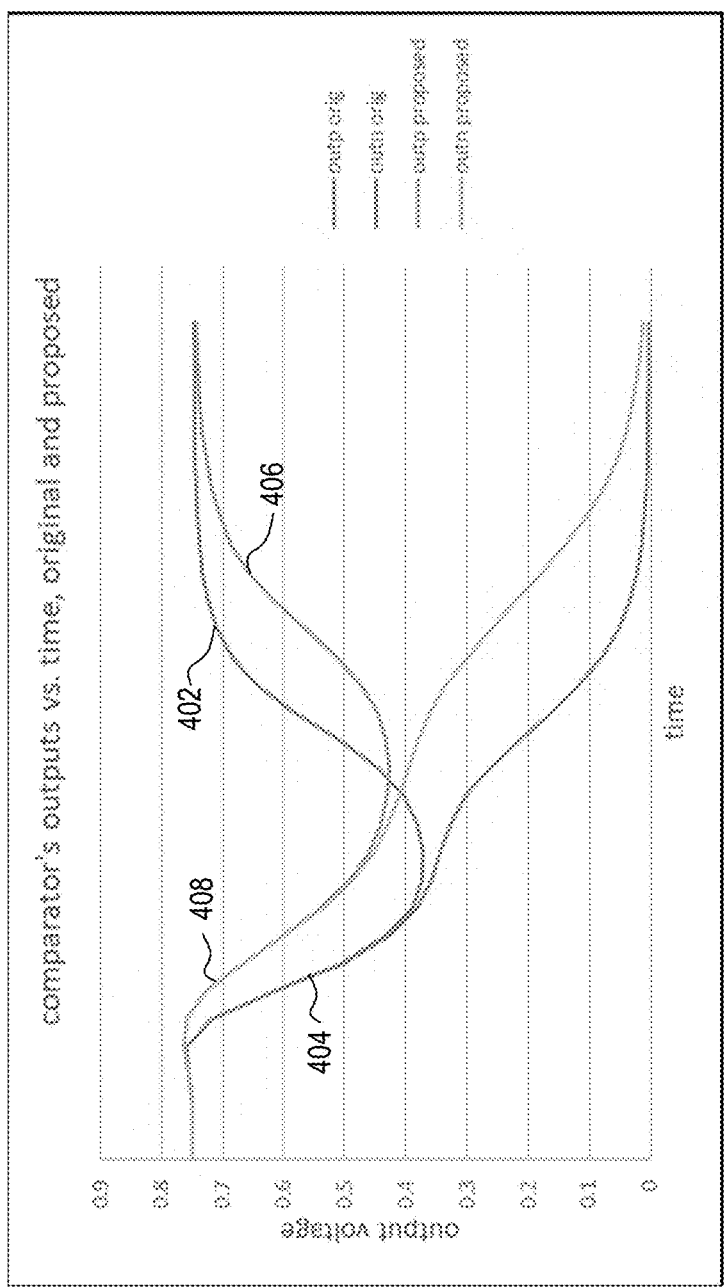
FIG. 4 is a chart illustrating a comparison between outputs of an original comparator compared to the proposed comparator, according to example embodiments.

FIG. 4 is a chart 400 illustrating a comparison between outputs of a comparator (e.g., a StrongARM comparator) compared with a comparator with a speed control element (e.g., comparator 100 with speed control element 101), according to example embodiments. As can be shown, a significant differential voltage is developed earlier in conventional comparators compared to the currently disclosed comparator because in the present comparator, with the speed control element, the integration operation was slowed down.

For example, as illustrated, chart 400 shows Outp of a comparator without a speed control element (e.g., "outp orig" corresponding to reference numeral 402), Outn of a comparator without a speed control element (e.g., "outn orig" corresponding to reference numeral 404), Outp of a comparator with a speed control element (e.g., "outp proposed" corresponding to reference numeral 406), and Outn of a comparator with a speed control element (e.g., "outn proposed" corresponding to reference numeral 408).

Figure 5:
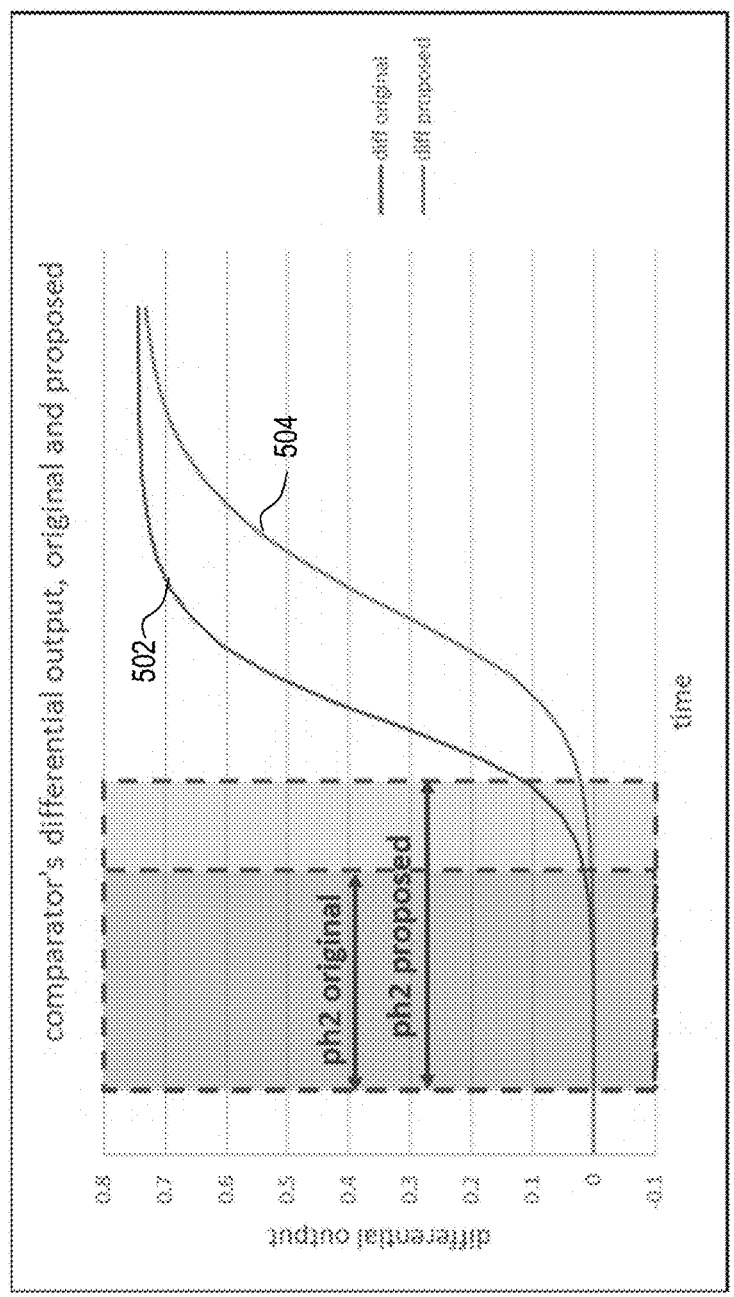
FIG. 5 is a chart illustrating a comparison between a differential outputs of an original comparator compared to differential outputs of the proposed comparator, according to example embodiments.

FIG. 5 is a chart 500 illustrating a comparison between differential outputs of a conventional StrongARM comparator compared to differential outputs of a comparator with a speed control element (e.g., comparator 100 with speed control element 101), according to example embodiments. For example, reference numeral 502 may correspond to the differential output of a conventional StrongARM comparator; reference numeral 504 may correspond to the differential output of a comparator with a speed control element. As shown, by including speed control element 101, the amplification phase (e.g., phase two) can be extended past what was originally possible.

It will be appreciated to those skilled in the art that the preceding examples are exemplary and not limiting. It is intended that all permutations, enhancements, equivalents, and improvements thereto are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

The invention claimed is:

1. A speed control element for a comparator circuit, the speed control element comprising:
a variable voltage source configured supply a variable voltage to one or more transistors,
the one or more transistors configured to:
receive a clock signal;
control a swing of the clock signal to generate a swing controlled clock signal based on the variable voltage supplied by the variable voltage source; and
provide the swing controlled clock signal to control a speed of an amplification phase of the comparator circuit.

2. The speed control element of the comparator circuit of claim 1, wherein during a reset phase of the comparator circuit, the one or more transistors are configured to provide swing controlled clock logic to turn OFF another transistor of the comparator circuit.

3. The speed control element of the comparator circuit of claim 1, wherein during the amplification phase of the comparator circuit, the one or more transistors are configured to provide a swing controlled clock logic to turn ON another transistor of the comparator circuit.

4. The speed control element of the comparator circuit of claim 1, wherein the one or more transistors are configured to provide the swing controlled clock signal to another transistor of the comparator circuit based on a predetermined level of noise for the amplification.

5. The speed control element of the comparator circuit of claim 1, wherein the one or more transistors are configured to provide the swing controlled clock signal to another transistor of the comparator circuit based on an alignment of an output common voltage of the comparator circuit with switching points of downstream logic cells connected to the comparator circuit.

6. The speed control element of the comparator circuit of claim 5, wherein at least one of the downstream logic cell comprises an inverter.

7. The speed control element of the comparator circuit of claim 1, wherein the variable voltage source comprises a DC voltage source.

8. A comparator circuit comprising:
a speed control element comprising:
a variable voltage source configured supply a variable voltage to one or more transistors,
the one or more transistors configured to:
receive a clock signal;
control a swing of the clock signal to generate a swing controlled clock signal based on the variable voltage supplied by the variable voltage source; and
provide the swing controlled clock signal to control a speed of an amplification phase of the comparator circuit.

9. The comparator circuit of claim 8, wherein during a reset phase of the comparator circuit, the one or more transistors are configured to provide swing controlled clock logic to turn OFF another transistor of the comparator circuit.

10. The comparator circuit of claim 8, wherein during the amplification phase of the comparator circuit, the one or more transistors are configured to provide a swing controlled clock logic to turn ON another transistor of the comparator circuit.

11. The comparator circuit of claim 8, wherein the one or more transistors are configured to provide the swing controlled clock signal to another transistor of the comparator circuit based on a predetermined level of noise for the amplification.

12. The comparator circuit of claim 8, wherein the one or more transistors are configured to provide the swing controlled clock signal to another transistor of the comparator circuit based on an alignment of an output common voltage of the comparator circuit with switching points of downstream logic cells connected to the comparator circuit.

13. The comparator circuit of claim 12 wherein at least one of the downstream logic cells comprises an inverter.

14. The comparator circuit of claim 8, wherein the variable voltage sources comprises a DC voltage source.

15. A method of controlling a speed of a comparator circuit, the method comprising:
  supplying, by a variable voltage source of a speed control element of a comparator circuit, a variable voltage to one or more transistors of the speed control element;
  receiving, by the one or more transistors, a clock signal;
  controlling, by the one or more transistors, a swing of the clock signal to generate a swing controlled clock signal based on the variable voltage supplied by the variable voltage source; and
  providing, by the one or more transistors, the swing controlled clock signal to control a speed of an amplification phase of the comparator circuit.

16. The method of claim 15, wherein the providing of the swing controlled clock comprises:
  providing, by the one or more transistors, a swing controlled clock logic to turn OFF another transistor of the comparator circuit during a reset phase of the comparator circuit.

17. The method of claim 15, wherein the providing of the swing controlled clock comprises:
  providing, by the one or more transistors, a swing controlled clock logic to turn ON another transistor of the comparator circuit during the amplification phase of the comparator circuit.

18. The method of claim 15, wherein the providing of the swing controlled clock comprises:
  providing, by the one or more transistors, the swing controlled clock signal to another transistor of the comparator circuit based on a predetermined level of noise for the amplification.

19. The method of claim 15, wherein the providing of the swing controlled clock comprises:
  providing, by the one or more transistors, the swing controlled clock signal to another transistor of the comparator circuit based an alignment of an output common voltage of the comparator circuit with switching points of downstream logic cells connected to the comparator circuit.

20. The method of claim 15, wherein the variable voltage source comprises a DC voltage source.

* * * * *